(12) United States Patent
Campbell et al.

(10) Patent No.: US 7,944,694 B2
(45) Date of Patent: May 17, 2011

(54) LIQUID COOLING APPARATUS AND METHOD FOR COOLING BLADES OF AN ELECTRONIC SYSTEM CHASSIS

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 12/256,623

(22) Filed: Oct. 23, 2008

(65) Prior Publication Data
US 2010/0101765 A1 Apr. 29, 2010

(51) Int. Cl.
*H05K 7/20* (2006.01)
*F28F 7/00* (2006.01)
*H01L 23/34* (2006.01)

(52) U.S. Cl. .............. 361/699; 361/701; 361/679.53; 361/725; 361/727; 165/80.4; 165/80.5; 165/104.33; 174/15.1; 257/714

(58) Field of Classification Search .............. 361/699, 361/700, 701, 724–727; 165/80.4, 80.5, 165/104.33; 174/15.1; 257/714–716
See application file for complete search history.

(56) References Cited

U.S. PATENT DOCUMENTS

| | | | |
|---|---|---|---|
| 2,125,888 A | 8/1938 | Cordrey | |
| 2,512,545 A | 6/1950 | Hazard | |
| 2,548,325 A | 4/1951 | Smith | |
| 2,643,282 A | 6/1953 | Green | |
| 2,791,888 A | 5/1957 | Vani | |
| 3,109,485 A | 11/1963 | Fortier | |
| 3,143,592 A | 8/1964 | August | |

(Continued)

FOREIGN PATENT DOCUMENTS
DE 101 12 389 A1 10/2002
(Continued)

OTHER PUBLICATIONS

Office Action for U.S. Appl. No. 12/256,631 (U.S. Patent Publication No. 2010/0103614 A1), dated Apr. 21, 2010.

(Continued)

*Primary Examiner* — Zachary M Pape
(74) *Attorney, Agent, or Firm* — Dennis Jung, Esq.; Kevin P. Radigan, Esq.; Heslin Rothenberg Farley & Mesiti P.C.

(57) ABSTRACT

Apparatus and method are provided for facilitating liquid cooling of a plurality of blades of an electronic system chassis. The apparatus includes a chassis-level manifold assembly with a first coolant path and a plurality of second coolant paths. The first coolant path is isolated from the plurality of second coolant paths by a heat exchanger. The heat exchanger facilitates transfer of heat from coolant within the second coolant paths to coolant within the first coolant path. Each second coolant path is isolated from the other second coolant paths, and coolant passing therethrough facilitates cooling of a respective blade. When operational, each second coolant path forms a portion of a respective closed loop coolant path extending between the manifold assembly and the electronic system chassis, and in one embodiment, each blade is an immersion-blade, with multiple components thereof immersion-cooled by coolant flowing through the respective second coolant path.

16 Claims, 11 Drawing Sheets

U.S. PATENT DOCUMENTS

| | | | |
|---|---|---|---|
| 3,226,941 A | 1/1966 | Snelling | |
| 3,404,730 A | 10/1968 | Kurisu | |
| 3,476,175 A | 11/1969 | Plevyak | |
| 3,512,582 A | 5/1970 | Chu et al. | |
| 3,578,014 A | 5/1971 | Gachot | |
| 3,586,101 A | 6/1971 | Chu et al. | |
| 3,600,636 A | 8/1971 | Petersen | |
| 3,609,991 A | 10/1971 | Chu et al. | |
| 3,774,677 A | 11/1973 | Antonetti et al. | |
| 3,858,090 A | 12/1974 | Lehmann | |
| 4,064,300 A | 12/1977 | Bhangu | |
| 4,108,242 A | 8/1978 | Searight et al. | |
| 4,201,195 A | 5/1980 | Sakhuja | |
| 4,302,793 A | 11/1981 | Rohner | |
| 4,430,866 A | 2/1984 | Willitts | |
| 4,590,538 A | 5/1986 | Cray, Jr. | |
| 4,622,946 A | 11/1986 | Hurley et al. | |
| 4,694,378 A | 9/1987 | Nakayama et al. | |
| 4,704,658 A | 11/1987 | Yokouchi et al. | |
| 4,741,385 A | 5/1988 | Bergles et al. | |
| 4,750,086 A | 6/1988 | Mittal | |
| 4,912,600 A | 3/1990 | Jaeger et al. | |
| 4,928,206 A | 5/1990 | Porter et al. | |
| 4,928,207 A | 5/1990 | Chrysler et al. | |
| 4,962,444 A | 10/1990 | Niggemann | |
| 5,021,924 A | 6/1991 | Kieda et al. | |
| 5,057,968 A | 10/1991 | Morrison | |
| 5,063,476 A | 11/1991 | Hamadah et al. | |
| 5,067,047 A | 11/1991 | Azar | |
| 5,126,919 A | 6/1992 | Yamamoto et al. | |
| 5,168,348 A | 12/1992 | Chu et al. | |
| 5,183,104 A | 2/1993 | Novotny | |
| 5,220,804 A | 6/1993 | Tilton et al. | |
| 5,270,572 A | 12/1993 | Nakajima et al. | |
| 5,305,184 A | 4/1994 | Andresen et al. | |
| 5,349,831 A | 9/1994 | Daikoku et al. | |
| 5,406,807 A | 4/1995 | Ashiwake et al. | |
| 5,414,592 A | 5/1995 | Stout et al. | |
| 5,458,185 A | 10/1995 | Mizuno | |
| 5,467,250 A | 11/1995 | Howard et al. | |
| 5,491,363 A | 2/1996 | Yoshikawa | |
| 5,675,473 A | 10/1997 | McDunn et al. | |
| 5,687,577 A | 11/1997 | Ballard et al. | |
| 5,718,117 A | 2/1998 | McDunn et al. | |
| 5,782,101 A | 7/1998 | Dennis | |
| 5,825,621 A | 10/1998 | Giannatto et al. | |
| 5,829,264 A | 11/1998 | Ishigaki et al. | |
| 5,854,092 A | 12/1998 | Root et al. | |
| 5,860,602 A | 1/1999 | Tilton et al. | |
| 5,864,466 A | 1/1999 | Remsburg | |
| 5,880,931 A | 3/1999 | Tilton et al. | |
| 5,907,473 A | 5/1999 | Przilas et al. | |
| 5,943,211 A | 8/1999 | Havey et al. | |
| 5,959,351 A | 9/1999 | Sasaki et al. | |
| 5,963,425 A | 10/1999 | Chrysler et al. | |
| 5,970,731 A | 10/1999 | Hare et al. | |
| 6,000,908 A | 12/1999 | Bunker | |
| 6,016,969 A | 1/2000 | Tilton et al. | |
| 6,019,167 A | 2/2000 | Bishop et al. | |
| 6,026,565 A | 2/2000 | Giannatto et al. | |
| 6,052,284 A | 4/2000 | Suga et al. | |
| 6,055,157 A | 4/2000 | Bartilson | |
| 6,139,361 A | 10/2000 | Przilas et al. | |
| 6,173,577 B1 | 1/2001 | Gold | |
| 6,193,905 B1 | 2/2001 | Yamada et al. | |
| 6,205,799 B1 | 3/2001 | Patel et al. | |
| 6,212,895 B1 | 4/2001 | Richardson | |
| 6,349,554 B2 | 2/2002 | Patel et al. | |
| 6,366,462 B1 | 4/2002 | Chu et al. | |
| 6,378,605 B1 | 4/2002 | Kutcher et al. | |
| 6,392,891 B1 | 5/2002 | Tzlil et al. | |
| 6,393,853 B1 | 5/2002 | Vukovic et al. | |
| 6,404,640 B1 | 6/2002 | Ishimine et al. | |
| 6,431,260 B1 | 8/2002 | Agonafer et al. | |
| 6,457,321 B1 | 10/2002 | Patel et al. | |
| 6,462,941 B1 | 10/2002 | Hulick et al. | |
| 6,519,151 B2 | 2/2003 | Chu et al. | |
| 6,536,510 B2 | 3/2003 | Khrustalev et al. | |
| 6,571,569 B1 | 6/2003 | Rini et al. | |
| 6,574,104 B2 | 6/2003 | Patel et al. | |
| 6,616,469 B2 | 9/2003 | Goodwin et al. | |
| 6,644,058 B2 | 11/2003 | Bash et al. | |
| 6,646,879 B2 | 11/2003 | Pautsch | |
| 6,807,056 B2 | 10/2004 | Kondo et al. | |
| 6,817,196 B2 | 11/2004 | Malone et al. | |
| 6,828,675 B2 | 12/2004 | Memory et al. | |
| 6,927,980 B2 | 8/2005 | Fukuda et al. | |
| 6,955,062 B2 | 10/2005 | Tilton et al. | |
| 6,973,801 B1 | 12/2005 | Campbell et al. | |
| 6,976,528 B1 | 12/2005 | Tilton et al. | |
| 7,011,143 B2 | 3/2006 | Corrado et al. | |
| 7,012,807 B2 | 3/2006 | Chu et al. | |
| 7,057,893 B2 | 6/2006 | Nicolai et al. | |
| 7,079,393 B2 | 7/2006 | Colgan et al. | |
| 7,088,585 B2 | 8/2006 | Chu et al. | |
| 7,104,078 B2 | 9/2006 | Tilton | |
| 7,106,590 B2 | 9/2006 | Chu et al. | |
| 7,134,289 B2 | 11/2006 | Patel et al. | |
| 7,143,605 B2 | 12/2006 | Rohrer et al. | |
| 7,187,549 B2 | 3/2007 | Teneketges et al. | |
| 7,191,954 B2 | 3/2007 | Kline | |
| 7,222,502 B2 | 5/2007 | Kobayashi et al. | |
| 7,233,491 B2 * | 6/2007 | Faneuf et al. | 361/689 |
| 7,251,139 B2 | 7/2007 | Bhattacharya et al. | |
| 7,252,100 B1 | 8/2007 | Downes et al. | |
| 7,258,161 B2 | 8/2007 | Cosley et al. | |
| 7,272,005 B2 | 9/2007 | Campbell et al. | |
| 7,285,851 B1 | 10/2007 | Cepeda-Rizo et al. | |
| 7,286,356 B2 | 10/2007 | Keenan et al. | |
| 7,295,440 B2 | 11/2007 | Ganev et al. | |
| 7,309,209 B2 | 12/2007 | Amiot et al. | |
| 7,349,213 B2 | 3/2008 | Campbell et al. | |
| 7,355,852 B2 | 4/2008 | Pfahnl | |
| 7,362,574 B2 | 4/2008 | Campbell et al. | |
| 7,365,973 B2 | 4/2008 | Rasmussen et al. | |
| 7,372,698 B1 | 5/2008 | Tilton et al. | |
| 7,375,962 B2 | 5/2008 | Campbell et al. | |
| 7,380,409 B2 | 6/2008 | Campbell et al. | |
| 7,385,810 B2 | 6/2008 | Chu et al. | |
| 7,392,660 B2 | 7/2008 | Tilton et al. | |
| 7,392,823 B2 | 7/2008 | Dong et al. | |
| 7,400,505 B2 | 7/2008 | Campbell et al. | |
| 7,408,776 B2 | 8/2008 | Campbell et al. | |
| 7,420,808 B2 | 9/2008 | Campbell et al. | |
| 7,428,151 B2 | 9/2008 | Sonnabend et al. | |
| 7,436,666 B1 | 10/2008 | Konshak | |
| 7,450,384 B2 | 11/2008 | Tavassoli et al. | |
| 7,450,385 B1 | 11/2008 | Campbell et al. | |
| 7,466,549 B2 | 12/2008 | Dorrich et al. | |
| 7,477,513 B1 | 1/2009 | Cader et al. | |
| 7,477,514 B2 | 1/2009 | Campbell et al. | |
| 7,495,914 B2 | 2/2009 | Tilton et al. | |
| 7,531,142 B2 | 5/2009 | Huziwara et al. | |
| 7,559,207 B2 | 7/2009 | Knight et al. | |
| 7,602,608 B2 | 10/2009 | Tilton et al. | |
| 7,630,795 B2 | 12/2009 | Campbell et al. | |
| 7,639,499 B1 | 12/2009 | Campbell et al. | |
| 7,641,101 B2 | 1/2010 | Campbell et al. | |
| 7,654,100 B2 | 2/2010 | Rini et al. | |
| 7,660,109 B2 | 2/2010 | Iyengar et al. | |
| 7,724,524 B1 | 5/2010 | Campbell et al. | |
| 2002/0062945 A1 | 5/2002 | Hocker et al. | |
| 2003/0230401 A1 | 12/2003 | Pfister et al. | |
| 2004/0057211 A1 | 3/2004 | Kondo et al. | |
| 2005/0207116 A1 | 9/2005 | Yatskov et al. | |
| 2005/0244280 A1 | 11/2005 | Malone et al. | |
| 2005/0254214 A1 | 11/2005 | Salmon | |
| 2006/0126296 A1 | 6/2006 | Campbell et al. | |
| 2006/0162365 A1 | 7/2006 | Hoang et al. | |
| 2006/0180300 A1 | 8/2006 | Lenehan et al. | |
| 2007/0025081 A1 | 2/2007 | Berlin et al. | |
| 2007/0035937 A1 | 2/2007 | Colbert et al. | |
| 2007/0121295 A1 | 5/2007 | Campbell et al. | |
| 2007/0159797 A1 | 7/2007 | Teneketges et al. | |
| 2007/0193300 A1 | 8/2007 | Tilton et al. | |
| 2007/0199204 A1 | 8/2007 | Knight et al. | |
| 2007/0199340 A1 | 8/2007 | Knight et al. | |

| | | |
|---|---|---|
| 2007/0201210 A1 | 8/2007 | Chow et al. |
| 2007/0291452 A1 | 12/2007 | Gilliland et al. |
| 2007/0295480 A1 | 12/2007 | Campbell et al. |
| 2007/0297136 A1 | 12/2007 | Konshak |
| 2008/0002363 A1 | 1/2008 | Campbell et al. |
| 2008/0018212 A1 | 1/2008 | Spearing et al. |
| 2008/0024991 A1 | 1/2008 | Colbert et al. |
| 2008/0062639 A1 | 3/2008 | Campbell et al. |
| 2008/0123297 A1 | 5/2008 | Tilton et al. |
| 2008/0158818 A1 | 7/2008 | Clidaras et al. |
| 2008/0196868 A1 | 8/2008 | Attlesey et al. |
| 2008/0209931 A1 | 9/2008 | Stevens |
| 2008/0225478 A1 | 9/2008 | Goettert et al. |
| 2009/0080173 A1 | 3/2009 | Schmidt et al. |
| 2009/0086428 A1 | 4/2009 | Campbell et al. |
| 2009/0086432 A1 | 4/2009 | Campbell et al. |
| 2009/0126909 A1 | 5/2009 | Ellsworth, Jr. et al. |
| 2009/0126910 A1 | 5/2009 | Campbell et al. |
| 2009/0133866 A1 | 5/2009 | Campbell et al. |
| 2009/0238235 A1 | 9/2009 | Campbell et al. |
| 2009/0260777 A1 | 10/2009 | Attlesey |
| 2009/0268404 A1 | 10/2009 | Chu et al. |
| 2009/0314467 A1 | 12/2009 | Campbell et al. |
| 2009/0316360 A1 | 12/2009 | Campbell et al. |
| 2010/0101759 A1 | 4/2010 | Campbell et al. |
| 2010/0103614 A1 | 4/2010 | Campbell et al. |
| 2010/0103618 A1 | 4/2010 | Campbell et al. |
| 2010/0103620 A1 | 4/2010 | Campbell et al. |

FOREIGN PATENT DOCUMENTS

| | | |
|---|---|---|
| JP | 8-254512 A | 10/1996 |

OTHER PUBLICATIONS

"Notification of Transmittal of the International Search Report and the Written Opinion of the International Searching Authority, or the Declaration", International Application No. PCT/EP2009/060792, dated Dec. 23, 2009.

RD 323064 A, Mar. 10, 1991, English Document.

Campbell et al., "Liquid-Based Cooling Apparatus for an Electronics Rack", U.S. Appl. No. 11/763,678, filed Jun. 15, 2007.

Iyengar et al., "Apparatus and Method for Facilitating Cooling of an Electronics System", U.S. Appl. No. 11/957,619, filed Dec. 17, 2007.

Goettert et al., "Heat Exchange System for Blade Server Systems and Method", U.S. Appl. No. 12/038,025, filed Feb. 27, 2008.

Chu et al., "Energy Efficient Apparatus and Method for Cooling and Electronics Rack", U.S. Appl. No. 12/108,020, filed Apr. 23, 2008.

Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).

Chee, B., "Supermicro Water Cooled Blades", Info World, Geeks in Paradise, (Mar. 5, 2008), http://weblog.infoworld.com/geeks/archives/2008/03.

Campbell et al., "Liquid Cooling Apparatus and Method of Facilitating Cooling of an Electronic System", U.S. Appl. No. 12/168,259, filed Jul. 7, 2008.

Hwang, U., "Heat Exchanger for Vapor Condensation by Dropwise Technique", IBM Technical Disclosure Bulletin, Publication No. IPCOM000089717D (Dec. 1, 1977).

Oktay et al., "Subcooled Flow Boiling with Flow Pattern Control", IBM Technical Disclosure Bulletin, Publication No. IPCOM000067827D (Oct. 1, 1979).

Hwang et al., "Evaporation Cooling Module", IBM Technical Disclosure Bulletin, Publication No. IPCOM000066472D (Mar. 1, 1979).

Delia et al., "System Cooling Design for the Water-Cooled IBM Enterprise System/900 Processors", IBM Journal of Research and Development, vol. 36, No. 4 pp. 791-803 (Jul. 1992).

Miyahara, M., "Small Fans for Cooling Small Electronic Devices", Electronics Cooling Magazine, online article retrieved from http://electronics-cooling.com/html/2009_may_techbrief.php (Aug. 31, 2009).

Nelson et al., "Thermal Performance of an Integral Immersion Cooled Multi-Chip Module Package", IEEE Transactions on Components, Packaging and Manufacturing Technology, Part A, vol. 17, No. 3 (Sep. 1994).

Zamanabadi et al., "Hybrid Control Challenges in Refrigeration Systems", Danfoss A/A, Denmark, Advanced Engineering—Refrigeration and Air Conditioning, EECI (2007).

Campbell et al., "Condenser Fin Structures Facilitating Vapor Condensation Cooling of Coolant", U.S. Appl. No. 12/491,286, filed on Jun. 25, 2009.

Campbell et al., "Condenser Structures with Fin Cavities Facilitating Vapor Condensation Cooling of Coolant", U.S. Appl. No. 12/491,287, filed on Jun. 25, 2009.

Campbell et al., "Apparatus and Method for Adjusting Coolant Flow Resistance Through Liquid-Cooled Electronics Rack(s)", U.S. Appl. No. 12/556,040, filed on Sep. 9, 2009.

Campbell et al., "Apparatus and Method with Forced Coolant Vapor Movement for Facilitating Two-Phase Cooling of an Electric Device", U.S. Appl. No. 12/565,175, filed on Sep. 23, 2009.

Campbell et al., "Liquid-Cooled Electronics Apparatus and Methods of Fabrication", U.S. Appl. No. 12/556,081, filed on Sep. 24, 2009.

Campbell et al., "Compliant Conduction Rail Assembly and Method Facilitating Cooling of an Electronics Structure", U.S. Appl. No. 12/570,215, filed on Sep. 30, 2009.

Campbell et al., "Cooled Electronic Module with Pump-Enhanced, Dielectric Fluid Immersion-Cooling", U.S. Appl. No. 12/491,281, filed on Jun. 25, 2009.

Campbell et al., "System and Method for Standby Mode Cooling of a Liquid-Cooled Electronics Rack", U.S. Appl. No. 12/567,954, filed on Sep. 28, 2009.

Campbell et al., "Cooling System and Method Minimizing Power Consumption in Cooling Liquid-Cooled Electronics Racks", U.S. Appl. No. 12/556,066, filed on Sep. 9, 2009.

Campbell et al., "Liquid-Cooled Electronics Rack with Immersion-Cooled Electronic Subsystems and Vertically-Mounted, Vapor-Condensing Unit", U.S. Appl. No. 12/825,745, filed on Jun. 29, 2010.

Campbell et al., "Immersion-Cooling Apparatus and Method for an Electronic Subsystem of an Electronics Rack", U.S. Appl. No. 12/825,756, filed on Jun. 29, 2010.

Campbell et al., "Interleaved, Immersion-Cooling Apparatus and Method for an Electronic Subsystem of an Electronics Rack", U.S. Appl. No. 12/825,761, filed on Jun. 29, 2010.

Campbell et al., "Interleaved, Immersion-Cooling Apparatuses and Methods for Cooling Electronic Subsystems", U.S. Appl. No. 12/825,776, filed on Jun. 29, 2010.

Campbell et al., "Liquid-Cooled Electronics Rack with Immersion-Cooled Electronic Subsystems", U.S. Appl. No. 12/825,781, filed on Jun. 29, 2010.

* cited by examiner

LIQUID COOLING APPARATUS AND METHOD FOR COOLING BLADES OF AN ELECTRONIC SYSTEM CHASSIS

TECHNICAL FIELD

The present invention relates to apparatuses and methods for facilitating cooling of an electronics system, such as a multi-blade center system, and more particularly, to apparatuses and methods for facilitating liquid-cooling of the blade units of one or more electronic system chassis.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of air that is exhausted into the computer center.

In many server applications, processors along with their associated electronics (e.g., memory, disc drives, power supplies, etc.) are packaged in removable drawer or blade configurations disposed within a housing. Typically, the components are cooled by air moving in parallel air flow paths, usually front-to-back, impelled by one or more air-moving devices (e.g., fans or blowers). In some cases, it may be possible to handle increased power dissipation within a single drawer or blade chassis by providing greater air flow, through the use of a more powerful air-moving device, or by increasing the rotational speed (i.e., RPMs) of an existing air-moving device. However, this approach is becoming problematic at the system level.

The sensible heat load carried by air exiting the electronics rack is stressing the ability of room air-conditioning to effectively handle the load. This is especially true for large installations with "server farms" or large banks of computer racks close together. In such installations, liquid cooling of selected components is an attractive technology to manage the higher heat fluxes. The liquid coolant absorbs the heat dissipated by selected components/modules in an efficient manner. Typically, the absorbed heat is ultimately transferred from the liquid to an outside environment, whether air or liquid-cooled.

SUMMARY OF THE INVENTION

The shortcomings of the prior art are overcome and additional advantages are provided through the provision of a liquid cooling apparatus for at least one electronic system chassis. The liquid cooling apparatus includes at least one chassis-level manifold assembly, wherein each chassis-level manifold assembly is configured to couple to a respective electronic system chassis of the at least one electronic system chassis. Each chassis-level manifold assembly includes a first coolant path and a plurality of second coolant paths, wherein the first coolant path is isolated from the plurality of second coolant paths by a heat exchanger. The heat exchanger facilitates transfer of heat from coolant within the second coolant paths to coolant within the first coolant path, and wherein each second coolant path of the plurality of second coolant paths is isolated from the other second coolant paths, and coolant passing through each second coolant path facilitates cooling of at least one component of the respective electronic system chassis. When operational, each second coolant path forms a portion of a respective closed loop coolant path of a plurality of closed loop coolant paths extending between the chassis-level manifold assembly and the respective electronic system chassis.

In another aspect, a cooled electronics rack is provided. The cooled electronics rack includes an electronics rack and a liquid cooling apparatus for facilitating cooling of one or more components of the electronics rack. The electronics rack at least partially surrounds and supports at least one electronic system chassis. The liquid coolant apparatus includes at least one chassis-level manifold assembly, each of which is coupled to the electronics rack adjacent to a respective electronic system chassis. Each chassis-level manifold assembly includes a first coolant path and a plurality of second coolant paths. The first coolant path is isolated from the plurality of second coolant paths by a heat exchanger. The heat exchanger facilitates transfer of heat from liquid coolant within the second coolant paths to coolant within the first coolant path, wherein each second coolant path of the plurality of second coolant paths is isolated from the other second coolant paths. Coolant passing through each second coolant path facilitates cooling of at least one component of the respective electronic system chassis. When the liquid cooling apparatus is operational, each second coolant loop forms a portion of a respective closed loop coolant path of a plurality of closed loop coolant paths extending between the chassis-level manifold assembly and the respective electronic system chassis.

In a further aspect, a method is provided for facilitating cooling of an electronics rack comprising at least one electronic system chassis comprising a plurality of blade units. The method includes: providing at least one chassis-level manifold assembly, each chassis-level manifold assembly being configured to facilitate liquid cooling of a plurality of blade units of a respective electronic system chassis of the at least one electronic system chassis, and wherein each chassis-level manifold assembly comprises a first coolant path and a plurality of second coolant paths, the first coolant path being isolated from the plurality of second coolant paths by a heat exchanger, the heat exchanger facilitating transfer of heat from coolant within the second coolant paths to coolant within the first coolant path, and wherein each second coolant path of the plurality of second coolant paths is isolated from the other second coolant paths, and coolant passing through each second coolant path facilitates cooling of a respective blade unit of the respective electronic system chassis; and coupling in fluid communication each second coolant path with the respective blade unit of the respective electronic system chassis, wherein each second coolant path forms a portion of a closed loop coolant path of a plurality of closed loop coolant paths extending between the chassis-level manifold assembly and the respective electronic system chassis.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1A:
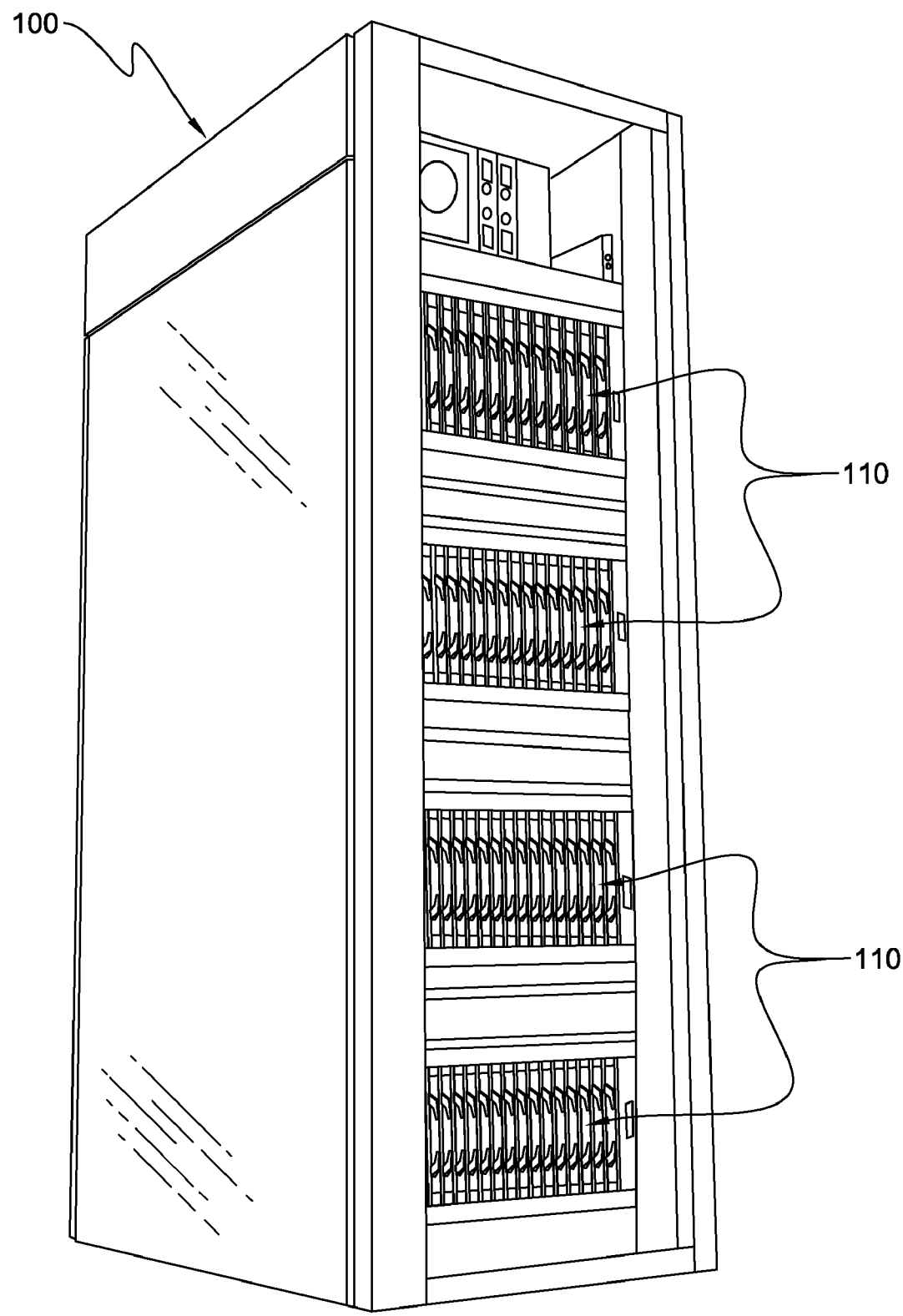
FIG. 1A depicts one embodiment of an electronics rack employing a stack of multiple-blade center systems to receive liquid coolant, in accordance with an aspect of the present invention.

As used herein, the term "electronics rack", includes any housing, frame, rack, compartment, blade server system, etc., having one or more heat generating components of a computer system, and may be, for example, a stand alone computer processor having high, mid or low end processing capability. In one embodiment, an electronics rack may comprise multiple electronics system chassis, each having multiple heat generating components or blades disposed therein requiring cooling. As one example, an electronic system chassis may be a multi-blade center system. The blades of each multi-blade center system may be removable, and comprise multiple components to be liquid-cooled. In one example, one or more blades of a multi-blade center system are immersion-cooled blades. "Immersion-cooled blades" refers to any blade, book, node, etc. having multiple components thereof cooled by immersion within coolant flowing through the blade. One detailed example of an immersion-cooled blade is described in co-filed, commonly assigned U.S. patent application entitled "Apparatus and. Method for Facilitating Immersion-Cooling of an Electronic Subsystem", Ser. No. 12/256,618, filed Oct. 23, 2008, published on Apr. 29, 2010, as U.S. Patent Publication No. 2010/0101759 A1, the entirety of which is hereby incorporated herein by reference. Multiple components of an immersion-cooled blade may be directly immersion-cooled by the coolant or indirectly immersion-cooled. Indirect immersion cooling refers to the existence of a thermal cap, thermal spreader, passivation layer, or other surface interposed between a surface of the component and the coolant within which the component is immersed.

As used herein, "heat exchanger" refers to any heat exchange assembly through which a first coolant and a second coolant can circulate. In the embodiments described herein, the first coolant is a liquid coolant, and the second coolant is a two-phase coolant which undergoes condensation within the heat exchanger. The heat exchanger comprises a first coolant path and a plurality of isolated second coolant paths, wherein a plurality of thermally conductive fins extend into the first coolant path and a plurality of thermally conductive fins extend into each of the plurality of second coolant paths. Otherwise, size, configuration and construction of the heat exchanger can vary without departing from the scope of the invention disclosed herein.

One example of the liquid coolant flowing through the first coolant path is water, and one example of the two-phase coolant flowing through the plurality of second coolant paths is a two-phase dielectric coolant. For example, the two-phase dielectric coolant may comprise a fluorocarbon or segregated hydrofluoroether liquid (e.g., FC-86, FC-87, FC-72, HFE-7000, HFE-7100, or HFE-7200, each of which is available from 3M Corporation, St. Paul, Minn., USA). Fluorocarbon liquid typically boils at 30° C.-80° C. at atmospheric pressure, while water boils at 100° C. Those skilled in the art should note, however, that the concepts disclosed herein are readily adapted to other types of first coolant and second coolant. For example, one or more of the coolants may comprise a brine, a liquid metal, or similar coolant, or a refrigerant, while still maintaining various advantages and unique features of the present invention.

Reference is made below to the drawings, which are not drawn to scale and are simplified for ease of understanding, and wherein the same reference numbers used throughout different figures designate the same or similar components.

FIG. 1A depicts one embodiment of an electronics rack 100 comprising a stack of electronic system chassis or multi-blade center systems 110, as well as supporting power supplies, networking equipment, etc.

Figure 1B:
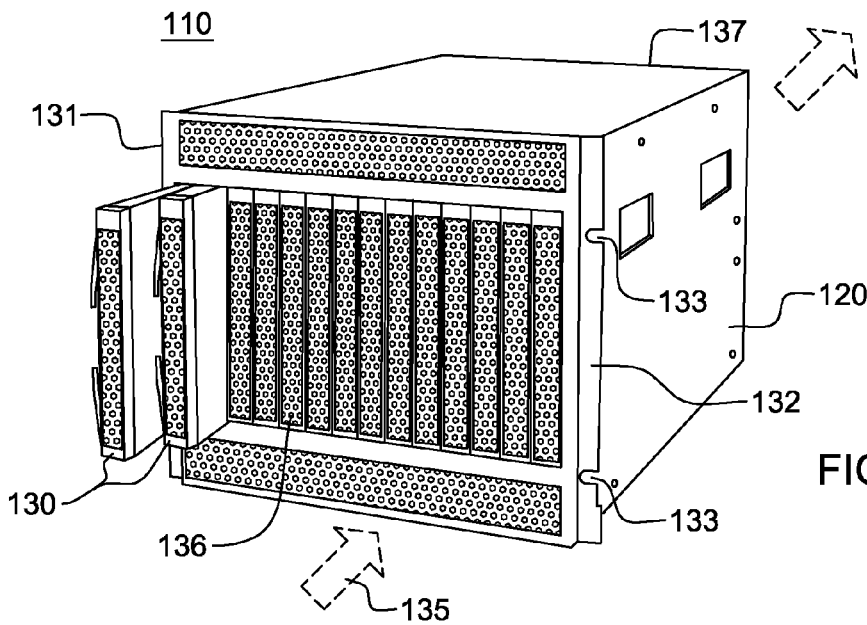
FIG. 1B is an isometric view of one embodiment of one multi-blade center system of the electronics rack of FIG. 1A.

FIG. 1B illustrates one embodiment of multi-blade center system 110, one example of which is marketed by International Business Machines Corporation, of Armonk, N.Y. By way of specific example, multi-blade center system 110 may comprise a stand alone server system which incorporates scalable computing functionality up to, for example, fourteen high performance servers (or blades).

As shown in FIG. 1B, multi-blade center system 110 includes a system chassis 120 and multiple removable blades 130. As one example, each removable blade 130 is an electronics subsystem, such as a server of a multi-server electronics system. A first flange 131 and second flange 132 with openings 133 are also illustrated. Typically, flanges 131, 132 are used to secure the multi-blade center system within an electronics rack, such as depicted in FIG. 1A. Airflow 135 is conventionally provided through an air inlet side 136 of multi-blade center system 110 to an air outlet side 137, and is typically established, for example, by two or more air-moving devices (not shown) disposed at the back portion of the system housing. Electrical and networking infrastructure is also located near the back of system chassis 120.

Figure 1C:
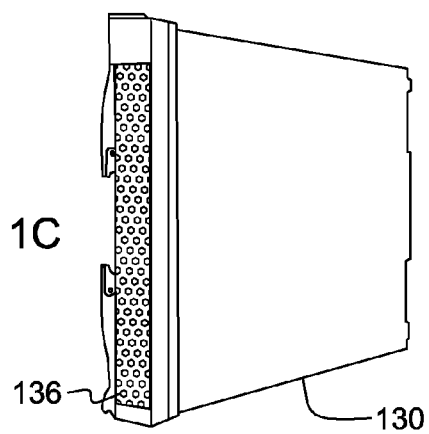
FIG. 1C is an isometric view of one embodiment of an individual removable blade of a multi-blade center system of FIG. 1B.
Figure 1D:
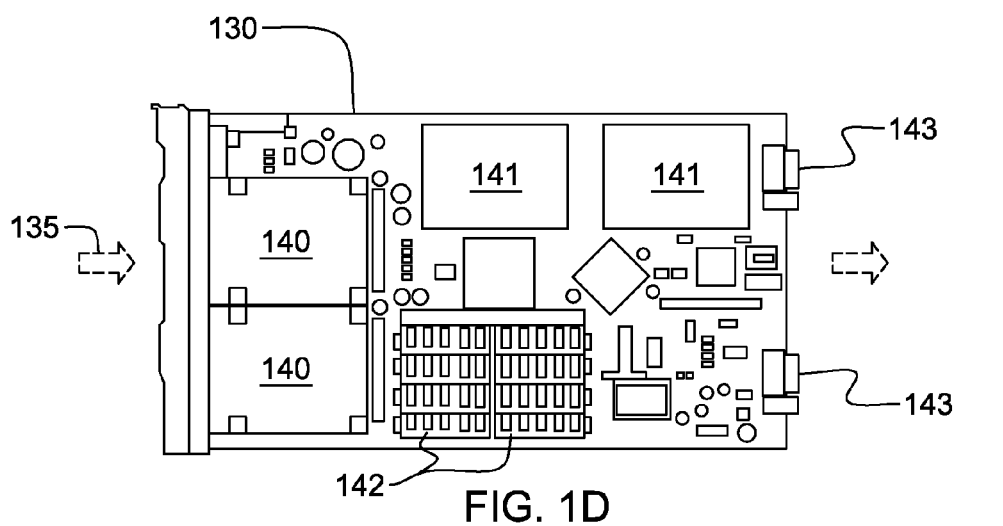
FIG. 1D is a side elevational view of one embodiment of the removable blade of FIG. 1C.

FIGS. 1C & 1D depict one embodiment of a removable blade 130 of the electronic system chassis. As illustrated in FIG. 1D, removable blade 130 includes, for example, multiple processors above which conventionally reside respective air-cooled heat sinks 140. In this example, each removable blade is a complete computer system, or subsystem, and includes, for example, Direct Access Storage Device (DASD) 141 and Dual In-Line Memory Modules (DIMMs) 142. Electrical connectors 143 are provided for electrically connecting blade 130 to the respective electronic system chassis 120 (FIG. 1B). Corresponding electrical connectors are disposed within the electronic system chassis near the back thereof for making electrical connection to connectors 143 when the blade is inserted into the chassis in operational position.

By way of specific example, a typical blade center chassis today is 9 U tall (where 1 U equals 1.75 inches or 44.45 mm) and houses 14 field-replaceable blades, each containing two central processing units (CPUs). A standard electronics rack that is 42 U tall can thus accommodate four such blade center chassis (each 9 U tall), for a total of 56 blades and 112 CPU modules. International Business Machines Corporation markets three versions of a blade center chassis, namely, the BC, BCH and BC-Telco versions. FIGS. 1A-1D illustrate one example of a BCH chassis marketed by International Business Machines Corporation, however, the concepts presented herein are readily applicable to any blade center chassis configuration, as well as to other electronic system housing variants. Further, the liquid cooling apparatus described herein is readily adaptable to use with any housing version with multiple components to be immersion-cooled.

Advantageously, liquid cooling of a multi-blade center system, or an electronics rack such as depicted in FIG. 1A, provides increased cooling at the module and rack level, and enables higher performance systems than currently feasible using air-cooling. Further, a liquid cooling apparatus, such as described below, improves energy efficiency by eliminating or reducing requirements on one or more data center air-conditioning units; that is, by rejecting heat to liquid coolant, which in one example, is subsequently rejected to the ambient environment outside of the data center. With a liquid cooling approach such as described herein, the conventional air-moving devices within the multi-blade center systems and the electronics rack are eliminated, thereby reducing acoustic noise within the data center. Additionally, a reduced form factor of the processor's thermal solution is provided, thus allowing more functionality to be packaged within a single subsystem or blade. This added functionality could be memory, hard drives, or other devices, which would allow for a more competitive offering within the market place.

Co-pending U.S. patent application Ser. No. 12/168,259, filed Jul. 7, 2008, entitled "Liquid Cooling Apparatus and Method for Facilitating Cooling of an Electronic System", which is hereby incorporated herein by reference, discloses forced liquid cooling of selected components of one or more electronic system chassis. Disclosed hereinbelow is a liquid cooling apparatus which achieves 100% liquid cooling of, for example, the blades of a multi-blade center system, whether as a stand alone system, or stacked within an electronics rack with other multi-blade center systems.

Figure 2:
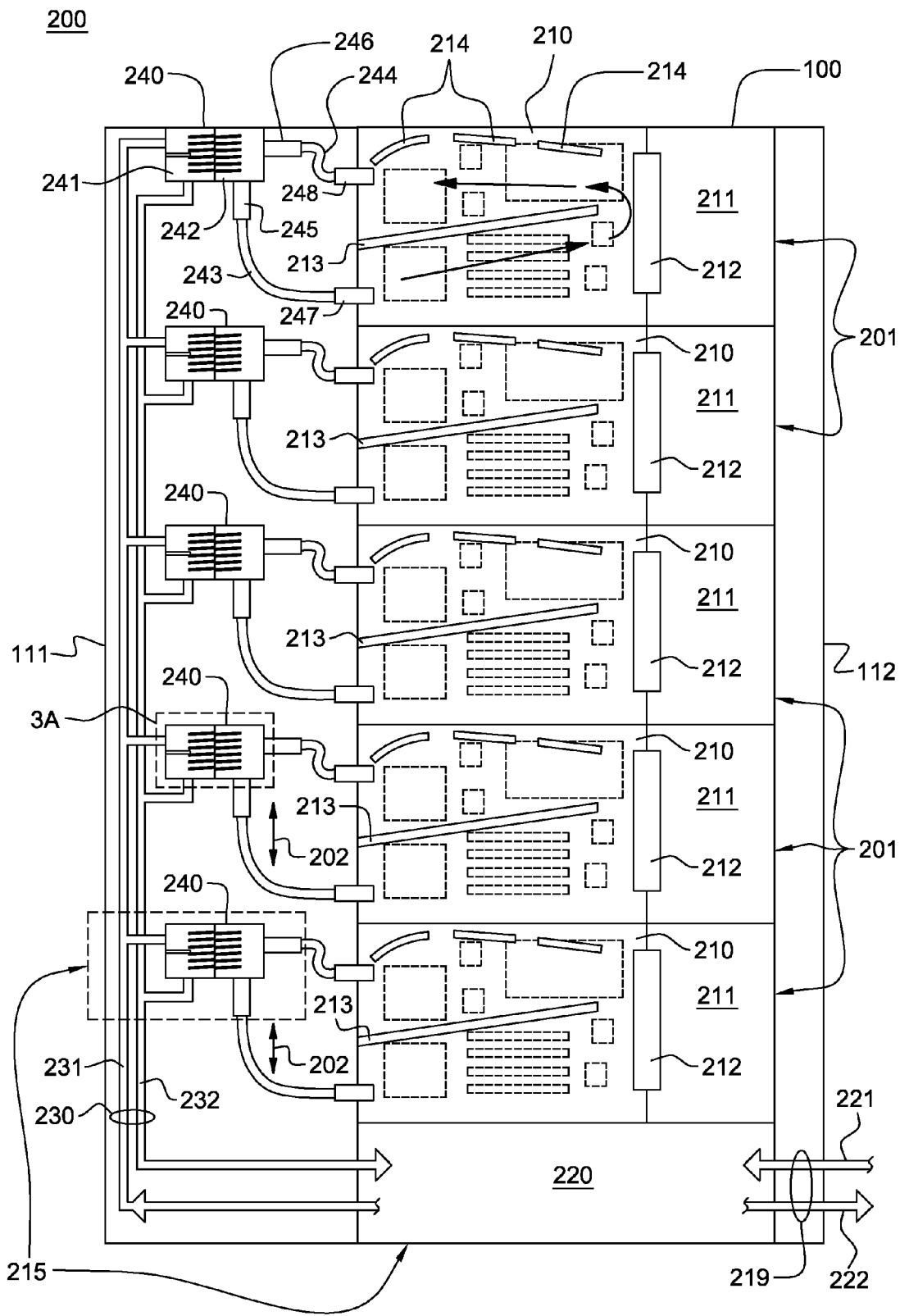
FIG. 2 is a schematic of one embodiment of a cooled electronics rack, comprising (in the illustrated embodiment) a stack of multi-blade center systems and a liquid cooling apparatus, in accordance with an aspect of the present invention.

FIG. 2 is a schematic of one embodiment of a cooled electronics rack, generally denoted 200, in accordance with an aspect of the present invention. Cooled electronics rack 200 includes an electronics rack 100 having a plurality of multi-blade center systems 201 stacked within the rack. In this example, five multi-blade center systems 201 are illustrated, with each system being an example of an electronic system chassis. As illustrated in FIG. 2, each multi-blade center system 201 includes a back plane 212, into which respective removable blades 210 are electrically inserted, and a back space 211 which conventionally accommodates one or more air-moving devices (not shown) to cause airflow to flow from a front side 111 to a back side 112 of electronics rack 100 through the multi-blade center system 201.

One embodiment of a liquid cooling apparatus, generally denoted 215, is illustrated in FIG. 2. In this embodiment, a liquid cooling unit 220 is disposed in a lower portion of electronics rack 100. Liquid cooling unit 220 includes, for example, a liquid-to-liquid heat exchanger (not shown) for extracting heat from coolant flowing through a first coolant loop 230 of liquid cooling apparatus 215 and dissipating heat within a facility coolant loop 219 comprising a facility coolant supply line 221 and facility coolant return line 222. In one example, facility coolant supply line 221 and facility coolant return line 222 couple liquid cooling unit 220 to a data center facility coolant supply and return (not shown). Liquid cooling unit 220 further includes an appropriately sized reservoir, pump, and optional filter, for moving liquid coolant through first coolant loop 230. In one embodiment, first coolant loop 230 includes a rack-level inlet manifold 231 and a rack-level outlet manifold 232, which are coupled to liquid cooling unit 220 via, for example, flexible hoses and respective quick connect couplings. The flexible hoses allow the rack-level manifolds to be mounted within, for example, a door of the electronics rack hingedly mounted to the air inlet side of the electronics rack in a manner similar to that described in co-pending, commonly assigned U.S. patent application Ser. No. 11/763,678, filed Jun. 15, 2007, entitled "Liquid-Based Cooling Apparatus for an Electronics Rack", the entirety of which is hereby incorporated herein by reference. In one example, rack-level inlet manifold 231 and rack-level outlet manifold 232 each comprise an elongated, rigid tube vertically mounted to electronics rack 100.

In the embodiment illustrated, the rack-level coolant manifold assembly, comprising rack-level inlet manifold 231 and rack-level outlet manifold 232 is in fluid communication with multiple movable chassis-level manifold subassemblies 240. Various examples of movable chassis-level manifold subassemblies mounted to an electronics rack are described in the above-incorporated, co-pending U.S. patent application Ser. No. 12/168,259, entitled "Liquid Cooling Apparatus and Method for Facilitating Cooling of an Electronics System". As illustrated in FIG. 2, each movable chassis-level manifold assembly is coupled to the electronics rack to reciprocate vertically (as indicated by arrows 202) adjacent to an associated electronic system chassis to facilitate the removal of individual blades, without impacting cooling of adjacent blades. Respective quick connect couplings may be employed to coupled the rack-level inlet manifold and rack-level outlet manifold to each movable chassis-level manifold assembly 240, using for example appropriately sized, flexible rack-level tubing. The quick connect couplings may be any one of various types of commercially available couplings, such as those available from Colder Products Company, of St. Paul, Minn., USA, or Parker Hannifin, of Cleveland, Ohio, USA.

Each movable chassis-level manifold assembly 240 includes a first chamber 241 and a plurality of second chambers 242 disposed, in this example, within a common structure, but isolated to prevent direct flow of coolant therebetween. As explained further below, the first chamber and the plurality of second chambers are isolated by a heat exchanger which facilitates transfer of heat from coolant flowing through a plurality of second coolant paths passing through the plurality of second chambers to coolant flowing through a first coolant path passing through the first chamber. Heat transferred to coolant passing through the first coolant path of each chassis-level manifold assembly is transferred via the rack-level outlet manifold 232 and liquid cooling unit 220 to facility coolant loop 219. In one example, coolant passing through first coolant loop 230, and hence, coolant passing through the first coolant paths within the movable chassis-level manifold assemblies, is water. In the example illustrated, the vertically oriented rack-level inlet and outlet manifolds each have five ports, which connect to five horizontally oriented, movable chassis-level manifold assemblies 240. The chassis-level manifold assemblies serve as a heat rejection component for the heat load removed from the individual blades 210 of the respective multi-blade center systems 201.

Each second chamber of the plurality of second chambers of each chassis-level manifold assembly 240 has an outlet coupled via flexible tubing 243 to a coolant inlet of a respective immersion-cooled blade 210. In one embodiment, each flexible tubing 243 couples to a respective second chamber of the chassis-level manifold assembly 240 via an appropriate hose barb fitting 245, and couples to the immersion-cooled blade 210 via a quick connect coupling 247. Further, flexible tubing 244 couples an inlet of each second chamber of the plurality of second chambers of each chassis-level manifold assembly 240 to a coolant outlet of the respective immersion-cooled blade 210. At the outlet, a quick connect coupling 248 may again be employed to facilitate connection or disconnection of the corresponding immersion-cooled blade, while at the other end, flexible tubing 244 couples to chassis-level manifold assembly 240 via an appropriate hose barb fitting 246. Flexible tubes 243, 244 are sized and provided with sufficient flexibility to allow the associated movable chassis-level manifold assembly 240 to reciprocate within a designed extent of travel, as illustrated by arrows 202.

As noted, in one example, a two-phase dielectric coolant is employed within immersion-cooled blade 210 and the second chambers of the respective chassis-level manifold assemblies 240. In operation, upper flexible tubing 244 transports vaporized coolant from the immersion-cooled blade 210 to the corresponding second chamber of the chassis-level manifold assembly. This second chamber functions as a condenser, with the lower flexible tubing 243 transporting condensed liquid coolant from the second chamber to the immersion-cooled blade 210 for continued cooling of the immersion-cooled blade. Electronic components within the blade may be exposed either directly or indirectly to the dielectric coolant, and heat transfer takes place via, for example, boiling at one or more surfaces of the heat-producing components. The liquid coolant, and resultant vapor, are directed via one or more baffles 213 to an upper portion of the blade 210, where the vapor rises to the top portion of the blade, and is directed via one or more vapor deflectors 214 back into the second chamber for condensing. Flow of vapor back to the second chamber is facilitated by the liquid-vapor pressure differential between the upper portion of the blade and the corresponding second chamber functioning as the condenser region. As discussed further below, both the first chamber and the plurality of second chambers of the chassis-level manifold assembly have thermally conductive fin structures extending therein from the heat exchanger to enhance heat transfer. These fin structures may comprise pin fin type thermally conductive elements, or plate type thermally conductive elements. The coolant flowing through the first chamber of each chassis-level manifold assembly yields a temperature at the condenser fins in the respective second chambers of the manifold assembly that is well below the boiling point of the dielectric coolant employed in the immersion-cooled blade. As a result, the vapor condenses over the surfaces of these fins. The condensed liquid may be close in temperature to the vapor, or it could be sub-cooled to a much lower temperature, based on operating conditions on the first coolant loop side of the manifold assembly's heat exchanger.

Figure 3A:
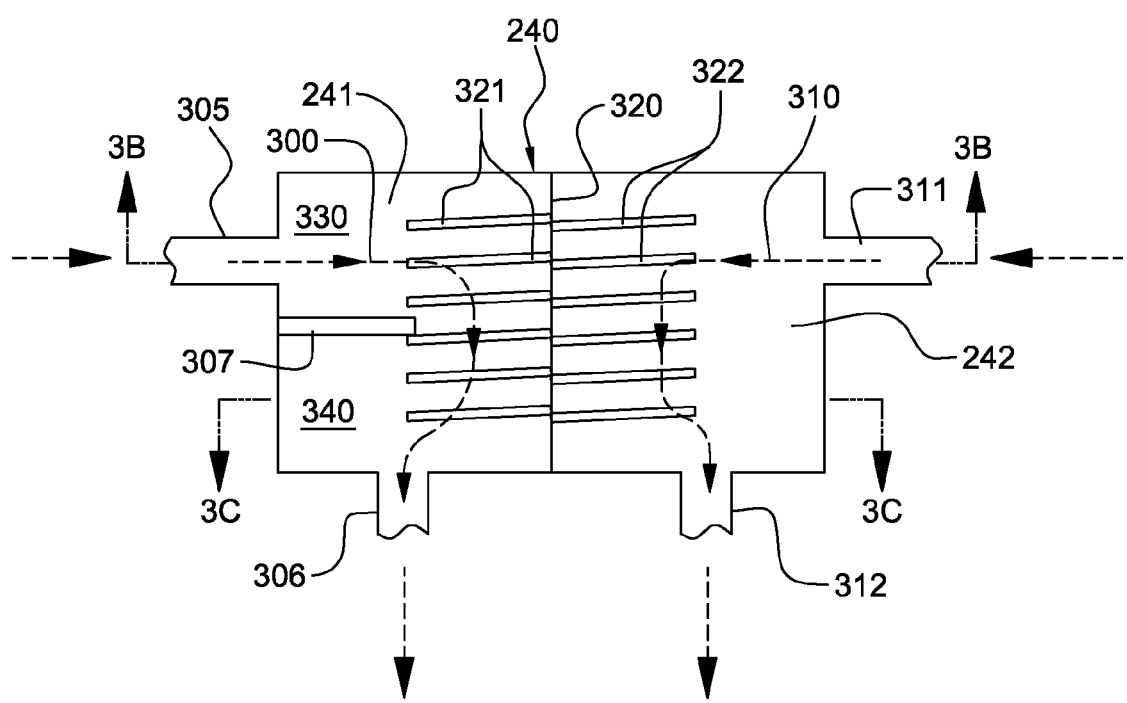
FIG. 3A is an enlarged side elevational view of one embodiment of a chassis-level manifold assembly of the liquid cooling apparatus of FIG. 2, viewed within line 3A, in accordance with an aspect of the present invention.
Figure 3B:
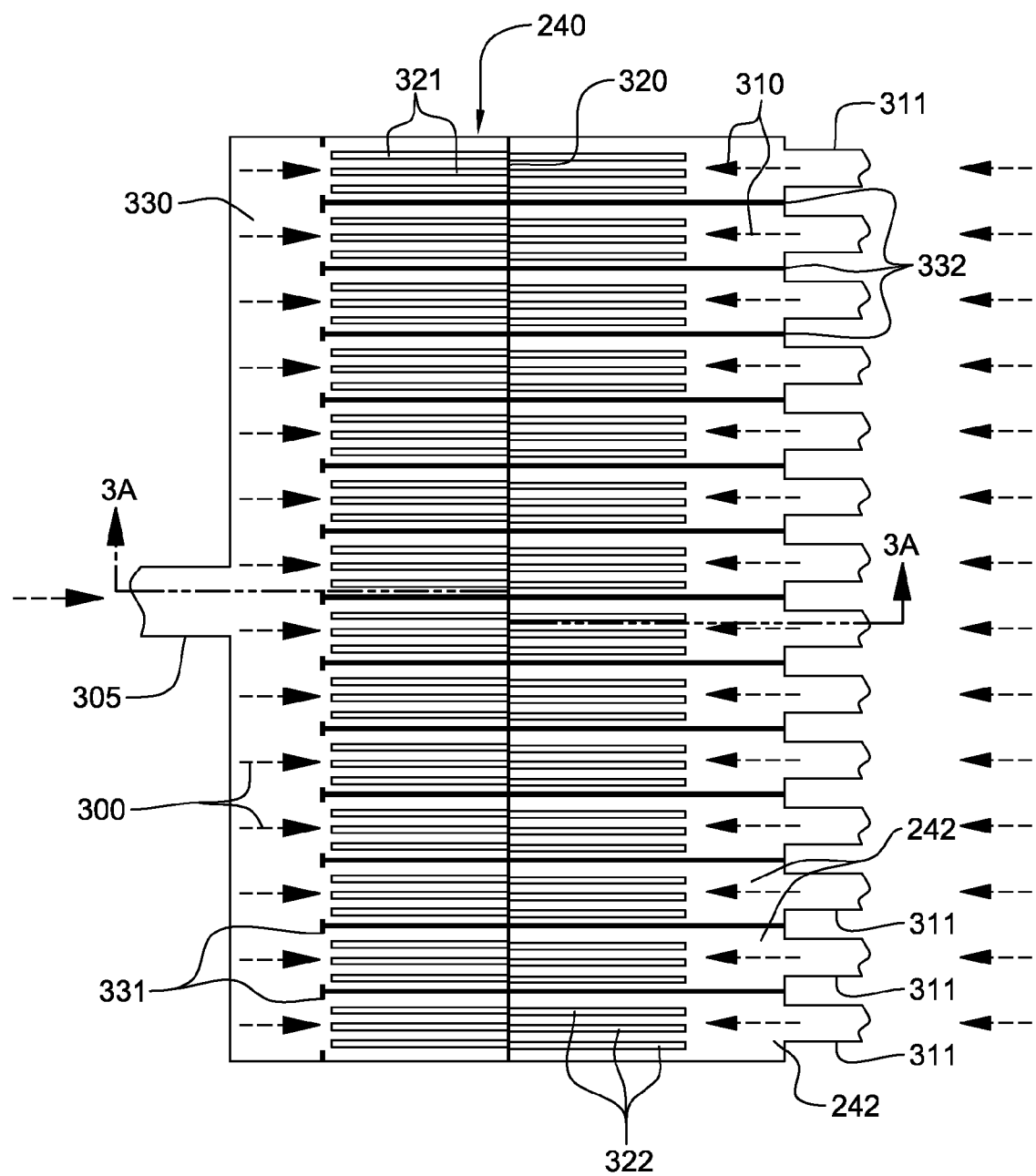
FIG. 3B is an upper cross-sectional view of the chassis-level manifold assembly of FIG. 3A, taken along line 3B-3B, in accordance with an aspect of the present invention.
Figure 3C:
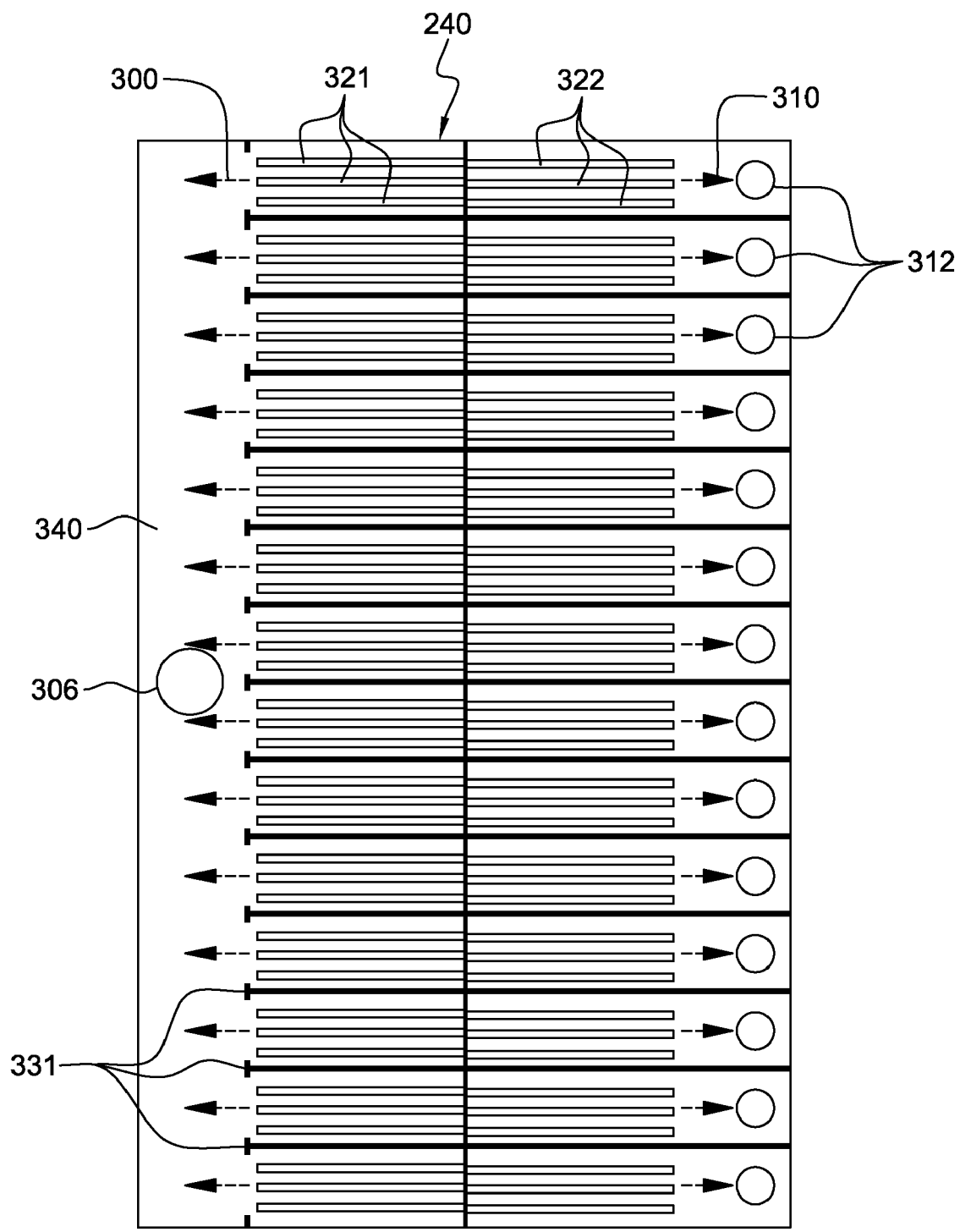
FIG. 3C is a lower cross-sectional view of the chassis-level manifold assembly of FIG. 3A, taken along line 3C-3C, in accordance with an aspect of the present invention.

FIGS. 3A-3C collectively illustrate a more detailed embodiment of a chassis-level manifold assembly 240, in accordance with an aspect of the present invention. This chassis-level manifold assembly 240 is highly modular in nature, with the left hand side comprising first chamber 241, and the right hand side one second chamber 242 of the plurality of second chambers of the chassis-level manifold assembly. In one embodiment, liquid coolant (such as water) flows via a first coolant path 300 through first chamber 241, and a two-phase dielectric coolant flows via a second coolant path 310 through a respective second chamber 242 of the plurality of second chambers of the chassis-level manifold assembly. Cooled water is received via a centrally located horizontal inlet port 305 into first chamber 241, and warm water is exhausted via a vertically disposed outlet port 306 located at the lower portion of first chamber 241. These inlet and outlet ports 305, 306 are in fluidic communication with the respective rack-level inlet and outlet manifolds described above. In this example, a plenum separator or plate 307 separates the two vertical plenums, that is, the inlet and outlet plenums 330, 340 labeled in FIGS. 3B & 3C. Thus, incoming coolant turns 90 degrees within first chamber 241 and passes through fin structures 321 as it flows through the manifold before exiting through outlet port 306, as illustrated by first coolant path 300 in FIG. 3A. Similarly, hot evaporated coolant is received via inlet port 311 into a respective second chamber 242 of the chassis-level manifold assembly, and cooled, condensed liquid coolant is return via outlet port 312 to the respective immersion-cooled blade. This second coolant path 310 is also illustrated in FIG. 3A. Condensation occurs, for example, on the surfaces of fin structures 322 of heat exchanger wall 320 projecting into the respective second chambers 242, wherein heat exchanger wall 320 separates first chamber 241 from the plurality of second chambers 242.

FIG. 3B depicts an upper cross-sectional view of the chassis-level manifold assembly of FIG. 3A, taken along line 3B-3B, while FIG. 3C depicts a lower cross-sectional view of the chassis-level manifold assembly of FIG. 3A, taken along line 3C-3C. As described above, plenum separator 307 of FIG. 3A separates upper level plenum 330 from lower level plenum 340. Further, separation walls 331 are provided within first chamber 241 to facilitate uniform flow of coolant through the first chamber to outlet port 306. This produces a parallel flow to each modular fin section depicted in FIGS. 3B & 3C, and ensures that each second chamber 242 is thermally coupled to coolant at the same approximate temperature within first chamber 241, thus providing a similar temperature differential for the condensation process in the different second chambers. Rigid walls 331 may be employed to isolate the individual sections within first chamber 241, which as noted above, include fin structures 321.

FIGS. 3B & 3C also depict the plurality of second chambers 242 within chassis-level manifold assembly 240. Inlet ports 311 are depicted in FIG. 3B, through each of which hot vaporized coolant is received from the respective immersion-cooled blade, while FIG. 3C illustrates outlet ports 312, through which the cooled, condensed liquid coolant is returned to the respective immersion-cooled blade. In the embodiment illustrated, each second chamber 242 includes a plurality of thermally conductive fins 322 extending from heat exchanger wall 320, which facilitate condensation of the hot vapor. The second coolant paths 310 are also illustrated in the upper and lower cross-sectional embodiments of FIGS. 3B & 3C, respectively. In the example depicted in. FIGS. 3B & 3C, the condenser portion of the chassis-level manifold assembly 240 is segmented, via a plurality of separation walls 332, into fourteen second chambers 242, each of which functions as a corresponding condenser unit and is in fluid communication with a corresponding immersion-cooled blade of the respective multi-blade center system. Advantageously, if a leak is detected in one blade of the multi-blade center system, it can be replaced without impacting operation of the remaining blades of the multi-blade center system.

Figure 4:
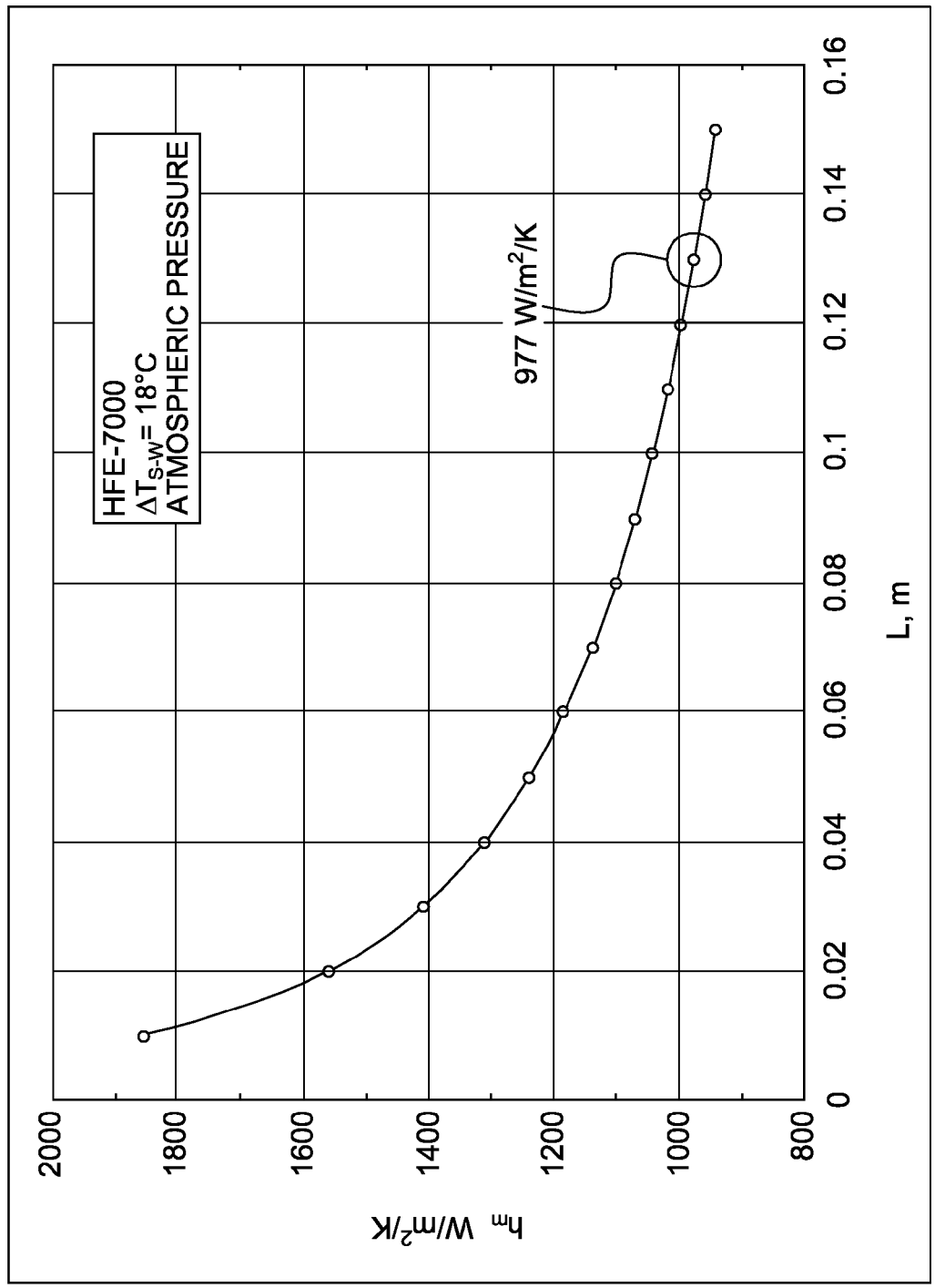
FIG. 4 is a graph of an estimated condensation heat transfer coefficient on the surface of a fin structure in a second coolant path of the chassis-level manifold assembly of FIGS. 3A-3C using HFE-7000 coolant, in accordance with an aspect of the present invention.

FIG. 4 graphically illustrates an estimated condensation heat transfer coefficient on the surface of the fin structures, $h_m$, within the second chambers of a chassis-level manifold assembly such as described above, and using HFE-7000 as the two-phase dielectric coolant, wherein L is the width of the fin in the vertical direction. For a 3 U or 133 mm high condenser, which is 50 mm deep, a value of 799 $W/m^2/K$ is projected. Using several other assumptions, e.g., 3.5 mm thick copper fins spaced 5.3 mm apart, with an 18° C. temperature differential between the condenser fin surface and the ambient saturated vapor, a heat dissipation rate of 466 W per immersion-cooled blade is estimated. This is well within typical maximum value for power dissipation that blade servers are being designed towards.

Figure 5:
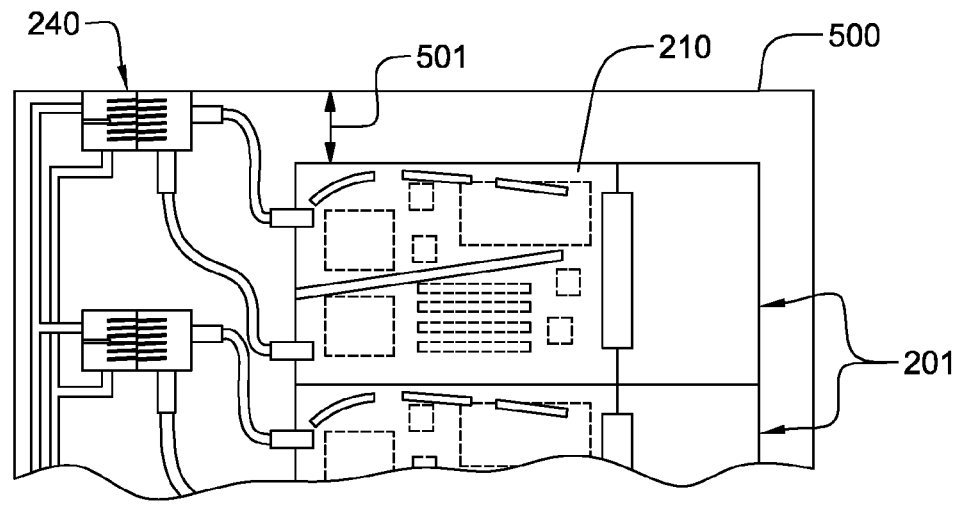
FIG. 5 is a partial schematic of an alternate embodiment of a cooled electronics rack, comprising (in the illustrated embodiment) a stack of multi-blade center systems and a liquid cooling apparatus, wherein the chassis-level manifold assemblies of the liquid cooling apparatus are disposed above their respective multi-blade center systems, in accordance with an aspect of the present invention.

FIG. 5 illustrates an alternate embodiment of a cooled electronic module, generally denoted 500, employing a liquid cooling apparatus such as described above in combination with multiple stacked multi-blade center systems, each of which contains a plurality of immersion-cooled blades 210, such as described above. In this embodiment, the movable chassis-level manifold assemblies 240 are disposed above the respective immersion-cooled blades of the respective system chassis of the multi-blade center systems 201. In one embodiment, 3 Us high space 501 may be employed to accommodate the movable chassis-level manifold assembly above the upper most multi-blade center system. Note also, that in this embodiment, it is possible for the upper most chassis-level manifold assembly to be fixedly secured to the electronics rack above the upper most electronic system chassis, while the remaining chassis-level manifold assemblies may be movable manifold assemblies such as described above. Advantageously, by locating the chassis-level manifold assemblies above the respective electronic system chassis, hot vapor from the immersion-cooled blades is more likely to completely fill the corresponding second chambers functioning as the condensers. Further, the depicted operating location of each manifold assembly advantageously facilitates removal of one or more blades of the respective multi-blade center system during a "hot swap" event.

Figure 6:
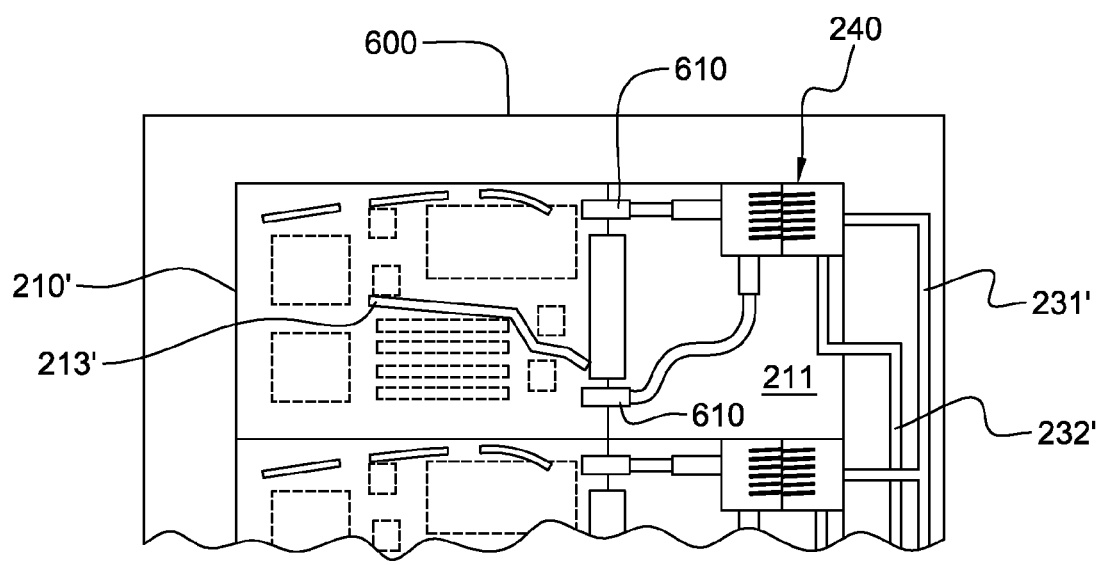
FIG. 6 is a partial schematic of an alternate embodiment of a cooled electronics rack, comprising (in the illustrated embodiment) a stack of multi-blade center systems and a liquid cooling apparatus, wherein the chassis-level manifold assemblies of the liquid cooling apparatus are disposed within a back portion of the respective multi-blade center systems, in accordance with an aspect of the present invention.

FIG. 6 illustrates another alternate embodiment of a cooled electronic module, generally denoted 600, which employs multiple stacked multi-blade center systems, each comprising a plurality of immersion-cooled blades 210'. In this embodiment, the rack-level inlet manifold 231' and rack-level outlet manifold 232' are disposed in the back of the electronics rack. Further, the individual chassis-level manifold assemblies 240 are positioned within space 211 at the back of the respective electronic system chassis. Blind mate quick connect couplings 610 facilitate insertion of the immersion-cooled blade 210' into operative fluid communication with the respective second chamber of the chassis-level manifold assembly 240. The blind mate quick connect couplings may comprise a pair of mating blind mate connectors that are disposed on the immersion-cooled blades, as well as within the electronic system chassis, as illustrated in FIG. 6. Advantageously, the chassis-level manifold assembly 240 is readily accommodated within the space previously occupied by the conventional air-moving devices at the back portion of an air-cooled multi-blade center system. Because of the positioning of the chassis-level manifold assemblies, either flexible or rigid tubing could be employed to connect each manifold assembly to the respective blind mate quick connect couplings 610. Also shown in this figure is a rippled baffle 213', which may be employed to accommodate existing blade components, while still directing coolant in the desired upward location, as described above in connection with the immersion-cooled blade 210 of FIG. 2.

Figure 7:
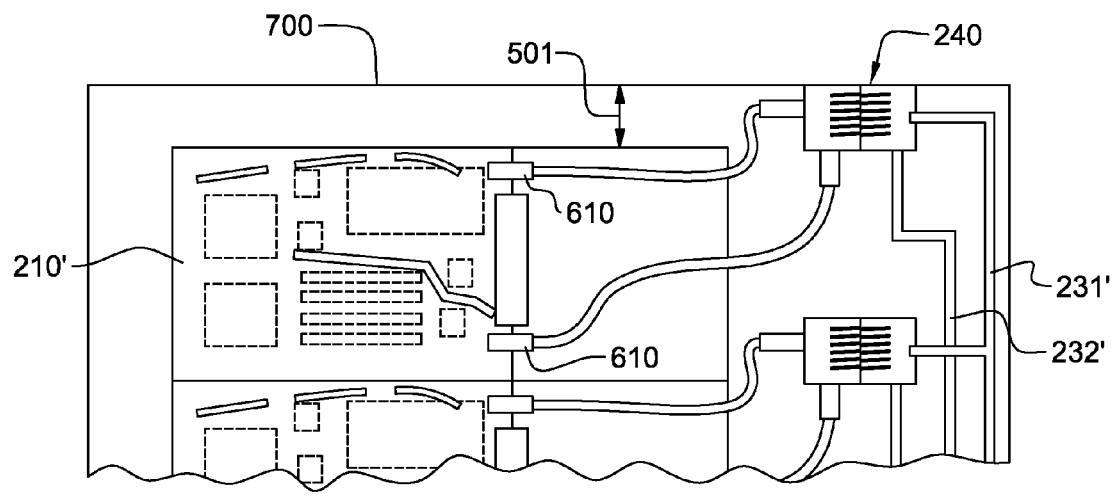
FIG. 7 is a schematic of an alternate embodiment of a cooled electronics rack, comprising (in the illustrated embodiment) a stack of multi-blade center systems and a liquid cooling apparatus, wherein the chassis-level manifold assemblies of the liquid cooling apparatus comprise moveable chassis-level manifold assemblies disposed within the electronics rack at the back of the multi-blade center systems, in accordance with an aspect of the present invention.

FIG. 7 depicts a further alternate embodiment of a cooled electronics module, generally denoted 700, in accordance with an aspect of the present invention. In this embodiment, the rack-level manifold assemblies 231', 232' are disposed at the back of electronics rack 700 and the chassis-level manifold assemblies 240. As shown, chassis-level manifold assemblies 240 are located external to the respective electronic system chassis, and flexible or rigid tubing may be employed to connect each second chamber of the plurality of second chambers of each chassis-level manifold assembly 240 to respective blind mate quick connect couplings 610 associated with each immersion-cooled blade 210'. In the embodiment illustrated, appropriate space 501 may be provided for accommodating the upper most chassis-level manifold assembly 240 above the upper most respective electronic system chassis. To facilitate access to the back of the individual electronic system chassis, the remaining chassis-level manifold assemblies 240 may be configured and mounted for vertical movement, such as described above in connection with the embodiment of FIG. 2.

Figure 8A:
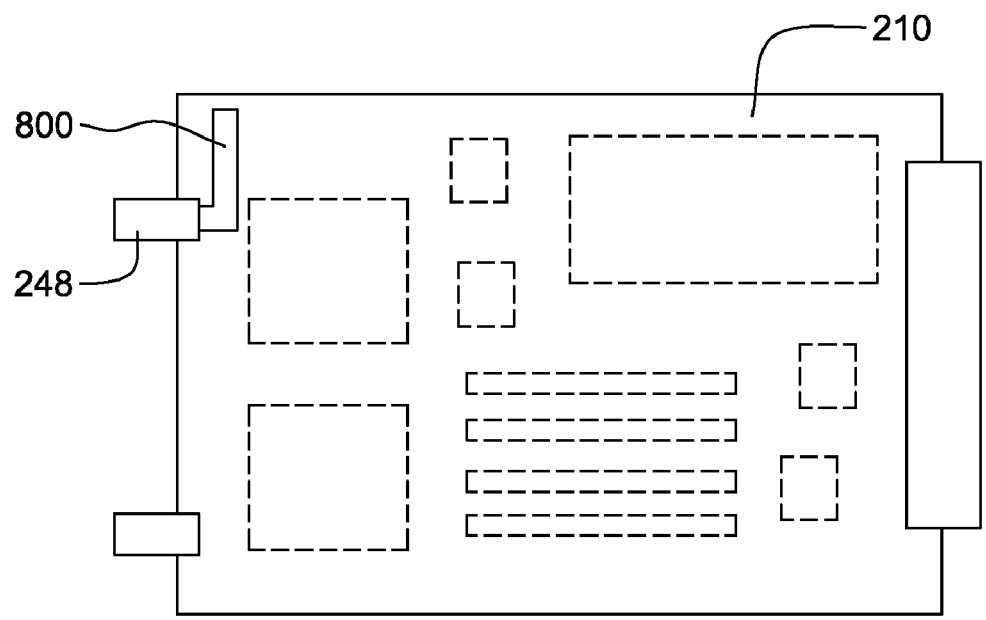
FIG. 8A is a side elevational view of an alternate embodiment of a removable, immersion-cooled blade of a multi-blade center system to be cooled, in accordance with an aspect of the present invention.
Figure 8B:
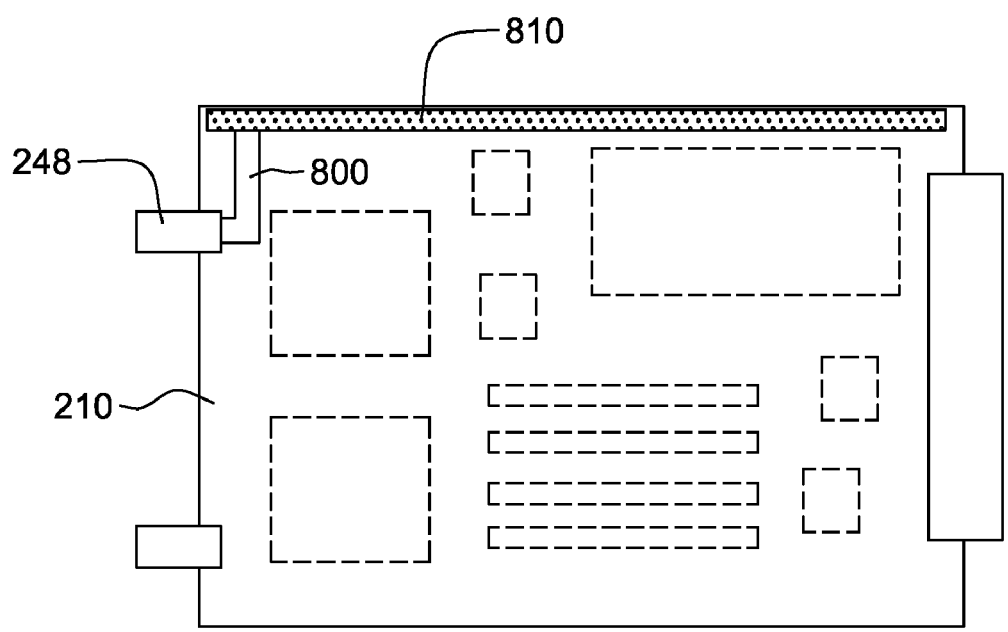
FIG. 8B is a side elevational view of another embodiment of an immersion-cooled blade of a multi-blade center system to be cooled, in accordance with an aspect of the present invention.
Figure 8C:
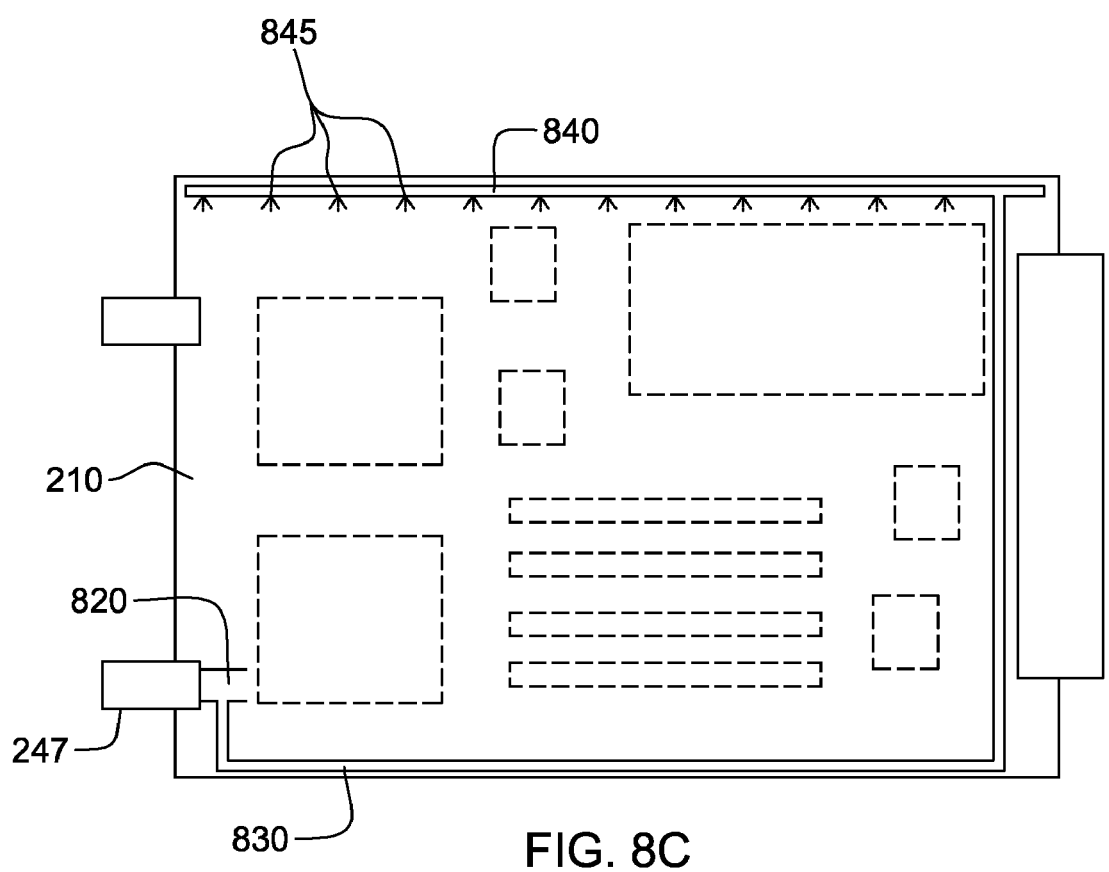
FIG. 8C is a side elevational view of a further embodiment of an immersion-cooled blade of a multi-blade center system to be cooled, in accordance with an aspect of the present invention.

FIGS. 8A-8C depict various alternate embodiments of an immersion-cooled blade 210, in accordance with an aspect of the present invention. In the embodiment of FIG. 8A, a snorkel-type tube 800 is coupled in fluid communication with outlet 248 to facilitate withdrawing of entrapped vaporized coolant 801 in the upper portion of immersion-cooled blade 210, above the vapor-liquid interface 802 between liquid dielectric coolant 803 within the immersion-cooled blade and the vaporized coolant. This configuration functions to limit vapor entrapment in the upper portion of the blade. Buoyancy-driven flow provides the necessary force to draw the vaporized coolant into tube 800.

In FIG. 8B, a perforated tube 810 is coupled in fluid communication with snorkel-type tube 800 of FIG. 8A for further facilitating removal of entrapped vaporized coolant 801 from the upper portion of immersion-cooled blade 210 via outlet connection 248. In one implementation, perforated tube 810 is sized and positioned so that when the immersion-cooled blade is operational, the vapor-liquid interface 802 between liquid dielectric coolant 803 and the vaporized coolant passes through the perforated tube.

In FIG. 8C, a further alternate embodiment is depicted wherein a main coolant supply port 820 introduces returning liquid coolant from the corresponding second chamber of the respective chassis-level manifold assembly via inlet connection 247. Additionally, a portion of the introduced liquid coolant flows via a bypass tube 830 to an upper tube 840 disposed in the upper portion of the immersion-cooled blade 210, that is, above the vapor-liquid interface 802 between vaporized coolant 801 and liquid dielectric coolant 803. This upper tube 840 includes multiple jet or spray vapor suppression orifices 845, which allow liquid coolant from the bypass flow tube 830 to be sprayed onto trapped vapor, and thereby suppress entrapment of vapor via condensation in the upper portion of the immersion-cooled blade 210.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A liquid cooling apparatus for at least one electronic system chassis, the liquid cooling apparatus comprising:
   at least one chassis-level manifold assembly, each chassis-level manifold assembly being configured to facilitate liquid cooling of a respective electronic system chassis of the at least one electronic system chassis;
   wherein each chassis-level manifold assembly comprises a first coolant path and a plurality of second coolant paths, the first coolant path being isolated from the plurality of second coolant paths by a heat exchanger, the heat exchanger facilitating transfer of heat from coolant within the second coolant paths to coolant within the first coolant path, and wherein each second coolant path of the plurality of second coolant paths is isolated from the other second coolant paths, and coolant passing through each second coolant path facilitates cooling of at least one respective component of the respective electronic system chassis, and wherein when the liquid cooling apparatus is operational, each second coolant path forms a portion of a respective closed loop coolant path of a plurality of closed loop coolant paths extending between the chassis-level manifold assembly and the respective electronic system chassis; and
   wherein each respective electronic system chassis comprises a plurality of blade units, and wherein for each chassis-level manifold assembly the liquid cooling apparatus further comprises tubing coupling each second coolant path of the plurality of second coolant paths of the chassis-level manifold assembly in fluid communication with a respective blade unit of the plurality of blade units of the respective electronic system chassis, and wherein at least one blade unit of the at least one electronic system chassis is an immersion-cooled blade with multiple components thereof immersion-cooled by coolant flowing through at least one respective second coolant path of the plurality of second coolant paths of the at least one chassis-level manifold assembly.

2. The liquid cooling apparatus of claim 1, wherein each blade unit of the at least one electronic system chassis is an immersion-cooled blade comprising multiple components immersion-cooled by coolant flowing through a respective second coolant path of the plurality of second coolant paths of the at least one chassis-level manifold assembly, the coolant flowing through the plurality of second coolant paths of each chassis-level manifold assembly comprising a two-phase dielectric coolant, and wherein when operational, a vapor portion of the two-phase dielectric coolant passing through the second coolant paths of the at least one chassis-level manifold assembly is condensed within the at least one chassis-level manifold assembly, the condensing occurring at the heat exchanger of each chassis-level manifold assembly via transfer of heat from the two-phase dielectric coolant in the respective second coolant paths to coolant in the first coolant path.

3. The liquid cooling apparatus of claim 1, wherein the at least one blade unit further comprises at least one baffle to direct coolant flow over the multiple components thereof to be immersion-cooled.

4. The liquid cooling apparatus of claim 3, wherein the at least one blade unit further comprises at least one vapor deflector to facilitate return of vaporized coolant to the at least one respective second coolant path of the at least one chassis-level manifold assembly.

5. The liquid cooling apparatus of claim 1, wherein each electronic system chassis of the at least one electronic system chassis comprises a multi-blade center system disposed within an electronics rack, and wherein the plurality of blade units of each multi-blade center system comprise a plurality of removable blades oriented vertically within the electronics rack, and each chassis-level manifold assembly of the at least one chassis-level manifold assembly couples to the electronic rack in a position which allows removal or servicing of the vertically oriented removable blades of the respective multi-blade center system.

6. The liquid cooling apparatus of claim 1, wherein each electronic system chassis of the at least one electronic system chassis comprises a multi-blade center system disposed within an electronics rack, and the plurality of blade units of each multi-blade center system comprise a plurality of removable blades oriented vertically within the electronics rack, and wherein each chassis-level manifold assembly of the at least one chassis-level manifold assembly is configured to movably mount to the electronics rack adjacent to the respective multi-blade center system, and when mounted to the electronics rack, each chassis-level manifold assembly is vertically movable to facilitate removal or servicing of the vertically oriented removable blades of the respective multi-blade center system.

7. The liquid cooling apparatus of claim 1, wherein each chassis-level manifold assembly is configured to mount in front of the respective electronic system chassis, and wherein the tubing coupling in fluid communication each second coolant path with the respective blade unit of the plurality of blade units of the respective electronic system chassis further comprises quick connect couplings.

8. The liquid cooling apparatus of claim 1, wherein each chassis-level manifold assembly is configured to mount at a back of the respective electronic system chassis, and wherein the tubing coupling in fluid communication each second coolant path with a respective blade unit of the plurality of blade units of the electronic system chassis further comprises blind mate quick connect couplings disposed at the blade unit.

9. The liquid cooling apparatus of claim 1, wherein each immersion-cooled blade comprises tubing therein to facilitate removal of vaporized coolant from the immersion-cooled blade for return to the respective second coolant path of the respective chassis-level manifold assembly when the at least one chassis-level manifold assembly is operatively coupled to the electronic system chassis, wherein coolant flowing through the plurality of second coolant paths of each chassis-level manifold assembly comprises a two-phase dielectric coolant.

10. The liquid cooling apparatus of claim 9, wherein the tubing within each immersion-cooled blade comprises at least one of a snorkel-type tubing disposed within an upper portion of the immersion-cooled blade to remove trapped vaporized coolant from the upper portion of the immersion-cooled blade, or tubing within the immersion-cooled blade to direct a portion of received liquid coolant to an upper portion of the immersion-cooled blade to suppress vaporized coolant at the upper portion of the immersion-cooled blade.

11. A liquid cooling apparatus for at least one electronic system chassis, the liquid cooling apparatus comprising:
at least one chassis-level manifold assembly, each chassis-level manifold assembly being configured to facilitate liquid cooling of a respective electronic system chassis of the at least one electronic system chassis;
wherein each chassis-level manifold assembly comprises a first coolant path and a plurality of second coolant paths, the first coolant path being isolated from the plurality of second coolant paths by a heat exchanger, the heat exchanger facilitating transfer of heat from coolant within the second coolant paths to coolant within the first coolant path, and wherein each second coolant path of the plurality of second coolant paths is isolated from the other second coolant paths, and coolant passing through each second coolant path facilitates cooling of at least one respective component of the respective electronic system chassis, and wherein when the liquid cooling apparatus is operational, each second coolant path forms a portion of a respective closed loop coolant path of a plurality of closed loop coolant paths extending between the chassis-level manifold assembly and the respective electronic system chassis; and
wherein the heat exchanger of each chassis-level manifold assembly comprises a plurality of fins extending into the first coolant path of the chassis-level manifold assembly, and a plurality of fins extending into each second coolant path of the plurality of second coolant paths of the chassis-level manifold assembly for facilitating transfer of heat from coolant passing through the plurality of second coolant paths to coolant passing through the first coolant path.

12. A cooled electronics rack comprising:
an electronics rack at least partially surrounding and supporting at least one electronic system chassis; and
a liquid cooling apparatus for facilitating cooling of a plurality of components of the at least one electronic system chassis, the liquid cooling apparatus comprising:
at least one chassis-level manifold assembly, each chassis-level manifold assembly being coupled to the electronics rack adjacent to a respective electronic system chassis of the at least one electronic system chassis;
wherein each chassis-level manifold assembly comprises a first coolant path and a plurality of second coolant paths, the first coolant path being isolated from the plurality of second coolant paths by a heat exchanger, the heat exchanger facilitating transfer of heat from coolant within the second coolant paths to coolant within the first coolant path, and wherein each second coolant path of the plurality of second coolant paths is isolated from the other second coolant paths, and coolant passing through each second coolant path facilitates cooling of at least one component of the respective electronic system chassis, and wherein when the liquid cooling apparatus is operational, each second coolant path forms a portion of a respective closed loop coolant path of a plurality of closed loop coolant paths extending between the chassis-level manifold assembly and the respective electronic system chassis; and
wherein each electronic system chassis of the at least one electronic system chassis comprises a plurality of immersion-cooled blades with multiple components thereof immersion-cooled by coolant flowing through a respective coolant path of the plurality of coolant paths of the at least one chassis-level manifold assembly, wherein the liquid cooling apparatus further comprises tubing coupling each second coolant path of the plurality of second coolant paths of each chassis-level manifold assembly in fluid communication with a respective immersion-cooled blade of the plurality of immersion-cooled blades of the respective electronic system chassis.

13. The cooled electronics rack of claim 12, wherein coolant flowing through the plurality of second coolant paths of each chassis-level manifold assembly comprises a two-phase dielectric coolant, the two-phase dielectric coolant passing through the second coolant paths of the at least one chassis-level manifold assembly being condensed within the at least one chassis-level manifold assembly, the condensing occurring at the heat exchanger of each chassis-level manifold assembly via transfer of heat from the two-phase dielectric coolant in the second coolant paths to coolant in the first coolant path, and wherein each immersion-cooled blade of the plurality of immersion-cooled blades of the at least one electronic system chassis comprises at least one baffle to direct coolant flow over the multiple components thereof being immersion-cooled, and at least one vapor deflector to facilitate return of vaporized coolant to the respective second coolant path of the at least one chassis-level manifold assembly.

14. The cooled electronics rack of claim 12, wherein the plurality of immersion-cooled blades within each electronic system chassis are removable blades oriented vertically within the electronics rack, and each chassis-level manifold assembly of the at least one chassis-level manifold assembly is coupled to the electronics rack in a position to allow removal or servicing of the vertically oriented immersion-cooled blades of the respective electronic system chassis.

15. The cooled electronics rack of claim 12, wherein the plurality of immersion-cooled blades of each electronic system chassis are removable blades oriented vertically within the electronics rack, and each chassis-level manifold assembly of the at least one chassis-level manifold assembly movably mounts to the electronics rack adjacent to the respective electronic system chassis, and each chassis-level manifold assembly is vertically movable to facilitate removal or servicing of the vertically oriented removable blades of the respective electronic system chassis.

16. A method of facilitating cooling of an electronics rack, the electronics rack comprising at least one electronic system chassis comprising a plurality of blade units, the method comprising:
providing at least one chassis-level manifold assembly, each chassis-level manifold assembly being configured to facilitate liquid cooling of a plurality of blade units of a respective electronic system chassis of the at least one electronic system chassis, and wherein each chassis-level manifold assembly comprises a first coolant path and a plurality of second coolant paths, the first coolant path being isolated from the plurality of second coolant paths by a heat exchanger, the heat exchanger facilitating transfer of heat from coolant within the second coolant paths to coolant within the first coolant path, and wherein each second coolant path of the plurality of second coolant paths is isolated from the other second coolant paths, and coolant passing through each second coolant path facilitates cooling of a respective blade unit of the respective electronic system chassis;

coupling in fluid communication each second coolant path with the respective blade unit of the respective electronic system chassis, wherein each second coolant path forms a portion of a closed loop coolant path of a plurality of closed loop coolant paths extending between the chassis-level manifold assembly and the respective electronic system chassis; and wherein each blade unit of the plurality of blade units of the at least one electronic system chassis is an immersion-cooled blade with multiple components thereof immersion-cooled by coolant flowing through the respective second coolant path of the plurality of second coolant paths of the at least one chassis-level manifold assembly, the coolant flowing through the plurality of second coolant paths of each chassis-level manifold assembly being a two-phase dielectric coolant, and wherein the two-phase dielectric coolant passing through the second coolant paths of the at least one chassis-level manifold assembly is condensed within the at least one chassis-level manifold assembly, the condensing occurring at the heat exchanger of each chassis-level manifold assembly by transfer of heat from the two-phase dielectric coolant in the respective second coolant paths to coolant in the first coolant path thereof.

\* \* \* \* \*